(12) United States Patent
Yin (10) Patent No.: US 10,498,524 B2
(45) Date of Patent: Dec. 3, 2019

(54) TIMING METHOD, CLOCK DEVICE AND TERMINAL DEVICE

(71) Applicant: SHENZHEN GOODIX TECHNOLOGY CO., LTD., Shenzhen (CN)

(72) Inventor: Tian Yin, Shenzhen (CN)

(73) Assignee: SHENZHEN GOODIX TECHNOLOGY CO., LTD., Shenzhen (CN)

(*) Notice: Subject to any disclaimer, the term of this patent is extended or adjusted under 35 U.S.C. 154(b) by 0 days.

(21) Appl. No.: 16/177,426

(22) Filed: Nov. 1, 2018

(65) Prior Publication Data

US 2019/0074957 A1    Mar. 7, 2019

Related U.S. Application Data

(63) Continuation of application No. PCT/CN2017/095918, filed on Aug. 4, 2017.

(51) Int. Cl.
*H04B 7/00* (2006.01)
*H04L 7/00* (2006.01)
(Continued)

(52) U.S. Cl.
CPC ............ *H04L 7/0016* (2013.01); *G06F 1/14* (2013.01); *H03L 7/1978* (2013.01); *H04W 52/0251* (2013.01); *H04W 52/0287* (2013.01)

(58) Field of Classification Search
CPC ............ H04L 7/0016; H04W 52/0251; H04W 52/0287; G06F 1/14; H03L 7/1978
(Continued)

(56) References Cited

U.S. PATENT DOCUMENTS 4,063,308 A * 12/1977 Collins ................. G06F 1/10
713/500
5,589,788 A * 12/1996 Goto ................. G01R 31/3191
327/276

(Continued)

FOREIGN PATENT DOCUMENTS

CN    101141514 A    3/2008
CN    101431816 A    5/2009
(Continued)

*Primary Examiner* — April G Gonzales (57) ABSTRACT

A timing method and a clock device are provided. The method includes: determining a timing point according to a timing duration of a clock device, where a clock period of the clock device is T, the timing duration is N times of a first time duration, and the first time duration is equal to $Q_2 \times T$, where $Q_2 = \lceil Q_1 \rceil$ or $Q_2 = \lfloor Q_1 \rfloor$, and $Q_1 = C/T$, N is a positive integer, $Q_1$ is not an integer, and C is a constant (210); and performing one adjustment on timing time of the clock device each time P first time durations elapse, where an amount of time for each adjustment is one clock period T, $P = 1/|Q_2 - Q_1|$ (220). Based on this method, accurate timing can still be effectively implemented when a ratio of a constant C (for example, 1.25 ms) to a clock period is not an integer.

18 Claims, 3 Drawing Sheets

(51) Int. Cl.
*G06F 1/14* (2006.01)
*H03L 7/197* (2006.01)
*H04W 52/02* (2009.01)

(58) Field of Classification Search
USPC .................................................. 455/41.2
See application file for complete search history.

(56) References Cited

U.S. PATENT DOCUMENTS

| | | | | |
|---|---|---|---|---|
| 5,805,870 | A * | 9/1998 | Browning | G06F 1/14 713/375 |
| 5,812,625 | A * | 9/1998 | Potier | G04F 10/10 377/20 |
| 6,226,230 | B1 * | 5/2001 | Watanabe | G01R 31/31922 327/175 |
| 6,266,625 | B1 * | 7/2001 | Johnson | G04G 3/00 377/28 |
| 6,292,062 | B1 | 9/2001 | Bourk et al. | |
| 6,453,181 | B1 * | 9/2002 | Challa | H03L 1/00 455/574 |
| 6,574,579 | B1 * | 6/2003 | Watanabe | G01R 31/31922 702/124 |
| 6,725,067 | B1 * | 4/2004 | Marx | H04W 52/0287 455/574 |
| 7,113,810 | B2 * | 9/2006 | Kim | H04W 52/0229 455/574 |
| 7,272,078 | B1 * | 9/2007 | Haartsen | H03L 1/00 324/76.41 |
| 7,324,559 | B2 * | 1/2008 | McGibney | H04J 3/0605 370/315 |
| 7,376,391 | B2 * | 5/2008 | Friedrich | H04L 1/0002 340/10.1 |
| 8,170,165 | B2 * | 5/2012 | Arviv | H03L 1/00 375/354 |
| 8,171,335 | B2 * | 5/2012 | Tsai | H03K 5/133 327/156 |
| 8,549,341 | B2 * | 10/2013 | Shahid | G06F 1/12 713/500 |
| 8,831,151 | B2 * | 9/2014 | Huang | H04L 7/0331 375/343 |
| 9,046,570 | B2 * | 6/2015 | Olmos | G01R 31/31719 |
| 9,473,146 | B2 * | 10/2016 | Fujisawa | H03K 21/026 |
| 9,520,860 | B2 * | 12/2016 | Whitehead | G06F 1/14 |
| 9,749,962 | B1 * | 8/2017 | Chi | G06F 1/3206 |
| 2006/0001498 | A1 * | 1/2006 | Lewis | H03K 23/68 331/158 |
| 2009/0167401 | A1 * | 7/2009 | Jones | G01R 31/31726 327/299 |
| 2010/0091923 | A1 | 4/2010 | Haentzschel et al. | |
| 2010/0182981 | A1 * | 7/2010 | Thoukydides | H04J 3/0658 370/336 |
| 2011/0204945 | A1 * | 8/2011 | Wagner | G06F 1/14 327/160 |
| 2011/0217935 | A1 * | 9/2011 | Shen | H04W 52/0287 455/67.11 |
| 2013/0124587 | A1 | 5/2013 | Haentzschel et al. | |
| 2016/0261816 | A1 * | 9/2016 | Margaux | H04N 5/33 |
| 2017/0102786 | A1 * | 4/2017 | Xu | G04F 1/00 |

FOREIGN PATENT DOCUMENTS

| | | |
|---|---|---|
| CN | 102355633 A | 2/2012 |
| CN | 103901942 A | 7/2014 |
| CN | 103955257 A | 7/2014 |
| CN | 104821820 A | 8/2015 |

* cited by examiner

FIG. 1 a timing point is determined according to a timing duration of a clock device, where the timing duration is N multiples of a first time duration, and the first time duration is equal to $Q_2 \times T$, where $Q_2 = \lceil Q_1 \rceil$ or $Q_2 = \lfloor Q_1 \rfloor$, and $Q_1 = C/T$, N is a positive integer, is not an integer, C is a constant timing time of the clock device is adjusted once each time P first time durations elapse, where an amount of time for each adjustment is one clock period T, $P = 1/|Q_2 - Q_1|$

TIMING METHOD, CLOCK DEVICE AND TERMINAL DEVICE

CROSS-REFERENCE TO RELATED APPLICATIONS

The present application is a continuation of international application No. PCT/CN2017/095918, filed on Aug. 4, 2017, which is hereby incorporated by reference in its entirety.

TECHNICAL FIELD

The present application relates to the field of information technologies, and in particular, to a timing method, a clock device, and a terminal device.

BACKGROUND

Bluetooth Low Energy (BLE) technology plays an important role in wireless transmission with low-cost and low-power requirements and is widely used in many fields such as healthcare, home, and entertainment due to low power consumption, for example, a button cell may allow it to work continuously for one year to several years.

Figure 1:
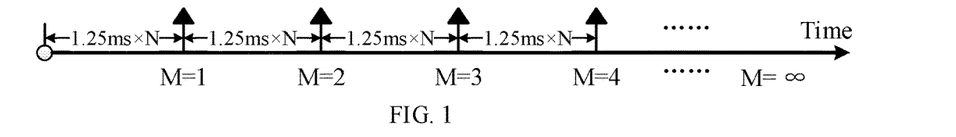
FIG. 1 is a schematic diagram of timing.

For a low-power Bluetooth device, a current protocol specifies that a timing duration of a clock device for implementing timing is 1.25 ms×N, that is, one timing point is reached each time 1.25 ms×N elapses, where N is a non-zero integer, and values of N may be different in different application scenarios. N may be called an interval (Interval), and 1.25 ms×N may be called a connection interval (Connection Interval, ConnInterval) or a timing duration. As shown in FIG. 1, black triangles in FIG. 1 identifies places to be timed. Timing points are 1.25 ms×N×M, respectively, and M is a positive integer.

Different clock devices have different clock frequencies, and clock periods also vary. The clock period may also be called an oscillatory period, and the clock period is a reciprocal of the clock frequency. In order to satisfy the precision requirement as much as possible, a clock device usually uses a clock period $T=1.25$ ms/$Q_1$ to perform accurate timing, where $Q_1$ is a positive integer. However, in some cases, when $Q_1$ is not an integer, that is, 1.25 ms is not an integral multiple of the clock period, it is difficult for the clock device to implement accurate timing.

SUMMARY

Embodiments of the present application provide a timing method, a clock device and a terminal device. When a ratio of a constant C (for example, 1.25 ms) to a clock period is not an integer, accurate timing can still be effectively implemented.

According to a first aspect, a timing method is provided, where the method is applied to a clock device in which a clock period is T, and the method includes:

determining a timing point according to a timing duration of a clock device, where a clock period of the clock device is T, the timing duration is N multiples of a first time duration, and the first time duration is equal to $Q_2 \times T$, where $Q_2 = \lceil Q_1 \rceil$ or $Q_2 = \lfloor Q_1 \rfloor$, and $Q_1 = C/T$, N is a positive integer, $Q_1$ is not an integer, C is a constant, $\lceil\ \rceil$ means rounding up, and $\lfloor\ \rfloor$ means rounding down; and performing one adjustment on timing time of the clock device each time P first time durations elapse, where an amount of time for each adjustment is one clock period T, $P=1/|Q_2-Q_1|$.

Therefore, in a timing process, if a ratio $Q_1$ of the constant C (for example, 1.25 ms) to the clock period T is not an integer, the timing point is determined according to the timing duration $Q_2 \times T \times N$, and one timing adjustment is performed each time a number of $1/|Q_2-Q_1|$ $Q_2 \times T$ durations elapse, so as to ensure that timing error is kept within an acceptable range and not increased with time, achieving accuracy timing of the clock device. Moreover, timing with low power consumption and low cost can be satisfied.

In some possible implementations, the clock device includes a first counter and a second counter, the first counter is configured to record a number of elapsed clock periods T, and the second counter is configured to record a number of the elapsed first time durations.

The performing one adjustment on timing time of the clock device each time P first time durations elapse includes: when the number of the clock periods T recorded by the first counter is equal to $Q_2$, setting the first counter to zero, and adding 1 to the number of the first time durations recorded by the second counter; and when the number of the first time durations recorded by the second counter reaches P, performing the timing adjustment, and setting the second counter to zero.

In some possible implementations, the clock device further includes a third counter, and the third counter is configured to record the number of the elapsed first time durations.

The performing one adjustment on timing time of the clock device each time P first time durations elapse includes: when the number of the clock periods T recorded by the first counter is equal to $Q_2$, adding 1 to the number of the first time durations recorded by the third counter; and when the number of the first time durations recorded by the third counter reaches N, determining that one timing point is reached and setting the third counter to zero.

In some possible implementations, performing one timing adjustment each time P first time durations elapse includes: adjusting the timing time of the clock device backward one clock period T each time P first time durations elapse.

In some possible implementations, timing error of the $M^{th}$ timing point of the clock device is $$\frac{|Q_2 - Q_1| \times \mathrm{mod}(N \times M, P)}{Q_1 \times N \times M},$$

where mod is a remainder, and M is a positive integer.

In some possible implementations, $Q_2=\lceil Q_1 \rceil$, the performing one adjustment on timing time of the clock device each time P first time durations elapse includes: adjusting the timing time of the clock device backward one clock period T each time P first time durations elapse.

In some possible implementations, $Q_2=\lfloor Q_1 \rfloor$, the performing one adjustment on timing time of the clock device each time P first time durations elapse includes: adjusting the timing time of the clock device forward one clock period T each time P first time durations elapse.

In some possible implementations, a constant $C=1.25$ ms.

In some possible implementations, $1/T=32.768$, and $P=25$.

According to a second aspect, a clock device is provided, including modules for performing the method of the first aspect or any possible implementations of the first aspect.

According to a third aspect, a clock device is provided, including a processor and a memory. The memory is configured to store instructions and the processor is configured to execute the instructions. When the processor executes the instructions stored by the memory, the execution causes the processor to perform the method of the first aspect or any possible implementations of the first aspect.

According to a fourth aspect, a computer readable medium is provided and used for storing a computer program, where the computer program includes instructions for performing the method of the first aspect or any possible implementation of the first aspect.

According to a fifth aspect, a timing chip is provided, including the clock device in the foregoing second aspect or any possible implementations of the second aspect.

According to a sixth aspect, a terminal device is provided, including the clock device in the foregoing second aspect or any possible implementations of the second aspect. The terminal device, for example, may be a Bluetooth device.

DESCRIPTION OF EMBODIMENTS

The technical solutions in embodiments of the present application will be described below with reference to the accompanying drawings.

FIG. 1 is a schematic diagram of timing. A timing duration (may be referred to as ConnInterval) of a clock device for implementing timing is 1.25 ms×N, that is, one timing point is reached each time 1.25 ms×N elapses. As shown in FIG. 1, black triangles in FIG. 1 identifies positions at which timing needs to be performed. Timing points are 1.25 ms×N×M, respectively, where M=0, 1, 2 . . . , ∞.

Different clock devices have different clock frequencies, and clock periods also vary. In order to satisfy the precision requirement as much as possible, a clock device generally uses a clock period T=1.25 ms/$Q_1$ to perform accurate timing, where $Q_1$ is a ratio of 1.25 ms to clock period T.

In the prior art, in order to ensure timing accuracy of the clock device, $Q_1$ will be set as an integer. There are currently two manners to make $Q_1$ an integer, that is, setting 1.25 ms to be equal to an integer multiple of the clock period. One manner is to allow the clock period T<1 us, and in this case, the value of T is very small, which will result in that power consumption of a crystal oscillator circuit of the clock device is too large; the other manner is to allow the clock period T=62.5 us, and in this case, although power consumption of the crystal oscillator circuit is reduced, the clock device needs a 32 k crystal, which is uncommon and therefore expensive.

In order to meet low power consumption and low cost requirements of the clock device, some clock devices with low power and low cost, such as a clock device including 32.768 k crystal may be considered, and clock periods of these clock devices generally cannot satisfy a condition that $Q_1$ is an integer. If $Q_1$ is not an integer, it is difficult for the clock device to achieve accurate timing. Therefore, the embodiment of the present application proposes that, when a ratio $Q_1$ of a constant C (for example, 1.25 ms described above) to a clock period T is not an integer, real-time timing adjustments are performed on the clock device according to the ratio $Q_1$ and the clock period T during timing, thereby efficiently implementing accurate timing.

Figure 2:
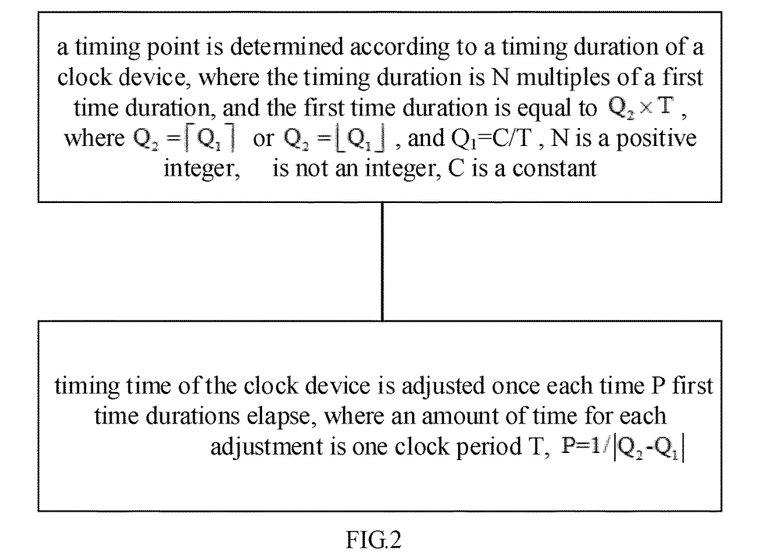
FIG. 2 is a schematic flowchart of a timing method according to an embodiment of the present application.

FIG. 2 is a schematic flowchart of a timing method 200 according to an embodiment of the present application. As shown in FIG. 2, the method 200 may include the following steps.

In 210, a timing point is determined according to a timing duration of a clock device.

A clock period of the clock device is T, the timing duration is N multiples of a first time duration, and the first time duration is equal to $Q_2 \times T$, where $Q_2 = \lceil Q_1 \rceil$ or $Q_2 = \lfloor Q_1 \rfloor$, and $Q_1 = C/T$, N is a positive integer, $Q_1$ is not an integer, C is a constant, $\lceil \ \rceil$ means rounding up, and $\lfloor \ \rfloor$ means rounding down.

Specifically, the clock device reaches one timing point each time one timing duration elapses, and the timing duration of the clock device is N multiples of the first time duration. In the embodiment of the present application, the first time duration is equal to $Q_2 \times T$. Since a constant C/T is not an integer (that is, $Q_1$ is not an integer), $Q_2 \times T$ (i.e., $\lceil Q_1 \rceil \times T$ or $\lfloor Q_1 \rfloor \times T$), rather than $Q_1 \times T$, is used as the first time duration. The clock device considers that it reaches one timing point each time N $Q_2 \times T$ elapse, thereby implementing accurate timing. The constant C may be, for example, 1.25 ms in the protocol, and in this case, $Q_1 = 1.25/T$.

Figure 3:
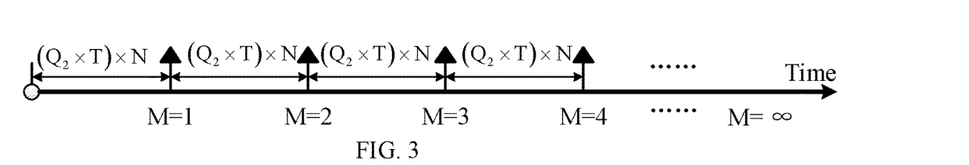
FIG. 3 is a schematic diagram of timing according to an embodiment of the present application.

FIG. 3 shows a schematic diagram of timing according to an embodiment of the present application. As shown in FIG. 3, it is considered that one timing point is reached each time N first time durations (i.e., $Q_2 \times T$) elapse. Black triangles in FIG. 3 identifies positions at which timing needs to be performed. Timing points are $Q_2 \times T \times N \times M$, respectively, where M=0, 1, 2 . . . , ∞. For example, when M=1, it is the first timing point, and when M=2, it is the second timing point. There is one timing duration between the first timing point and the second timing point. The timing duration is equal to N first time durations, and the first time duration is equal to $Q_2 \times T$.

The timing is performed based on the first time duration of $Q_2 \times T$ in the process of determining the timing point, and the timing duration is $Q_2 \times T \times N$. Therefore, there is a certain timing offset between an actual timing point determined in 210 and a real timing point. For example, the timing point of M=1 shown in FIG. 3 is different from the real timing point when M=1 by $Q_2 \times T \times N - Q_1 \times T \times N$, the timing point of M=2 is different from the corresponding real timing point by $Q_2 \times T \times N \times 2 - Q_1 \times T \times N \times 2$, and the timing deviation will accumulate over time. When M=i, the deviation between the $i^{th}$ timing point and the corresponding real timing point is $Q_2 \times T \times N \times i - Q_1 \times T \times N \times i$.

Therefore, according to the embodiment of the present application, the timing deviation is adjusted by performing 220 to achieve accurate timing of the clock device.

In 220, timing time of the clock device is adjusted once each time P first time durations elapse.

An amount of time for each adjustment is one clock period T, $P = 1/|Q_2 - Q_1|$.

Specifically, since a minimum unit for a timing adjustment of the clock device is one clock period T, the clock device can perform one timing adjustment each time the timing deviation is accumulated to one clock period T. In the embodiment of the present application, for the clock device, each time P first time durations elapse, the accumulated deviation reaches one clock period T, so that the timing time is adjusted once.

Therefore, for the clock device, in a timing process, if the ratio $Q_1$ of the constant C to the clock period T is not an integer, the timing point is determined according to the timing duration $Q_2 \times T \times N$, and one timing adjustment is performed each time $P=1/|Q_2-Q_1|Q_2 \times T$ durations elapse, so as to ensure that timing error is kept within an acceptable range and will not increase with time, achieving accurate timing of the clock device. Moreover, timing with low power consumption and low cost can be satisfied.

The following is a detailed description of how to determine the P value.

The actual timing point of the clock device is $Q_2 \times T \times N \times M$, and the real timing point should be $C \times N \times M$, that is, $(Q_1 \times T) \times N \times M$.

The real timing point is $C \times N \times M = Q_1 \times T \times N \times M = [Q_2-(Q_2-Q_1)] \times T \times N \times M = (Q_2 \times T) \times N \times M - [(Q_2-Q_1) \times T] \times N \times M$.

The first half of the formula $(Q_2 \times T) \times N \times M$ is the actual timing point of the clock device, and the second half $[(Q_2-Q_1) \times T] \times N \times M$ is a deviation between the actual timing point and the corresponding real timing point. It can be seen that when $N \times M$ is equal to an integral multiple of $1/|Q_2-Q_1|$, the deviation between the actual timing point and the real timing point is an integer multiple of the clock period T. $N \times M$ may be understood as a total number of elapsed first time durations. Each time $1/|Q_2-Q_1|$ first time durations elapse, the actual timing point is different from the real timing point by one clock period T, so that one timing adjustment is performed.

Figure 4:
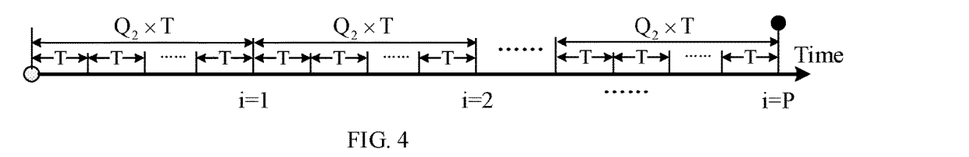
FIG. 4 is a schematic diagram of a timing adjustment according to an embodiment of the present application.

For example, FIG. 4 is a schematic diagram of a timing adjustment according to an embodiment of the present application. As shown in FIG. 4, the clock device may record a number i of elapsed first time durations, and one timing adjustment is performed each time $1/|Q_2-Q_1|$ first time durations elapse, where the first time duration is equal to $Q_2 \times T$. FIG. 4 shows an adjustment period including $1/|Q_2-Q_1|$ first time durations, and a time position for the timing adjustment is the position where the $(1/|Q_2-Q_1|)^{th}$ first time duration ends, i.e., the position that $i=P=1/|Q_2-Q_1|$. A black dot in FIG. 4 identifies the position at which the timing adjustment needs to be performed. At this time position, the clock device adjusts the timing time for one clock period T.

Therefore, in the embodiment of the present application, one adjustment is performed on timing time each time $1/|Q_2-Q_1|$ first time durations elapse, and an amount of time for each adjustment is equal to one clock period T.

Optionally, in 220, performing one adjustment on timing time of the clock device each time P first time durations elapse may include the following two cases.

Case 1

If $Q_2=\lceil Q_1 \rceil$, the timing time of the clock device is adjusted backward one clock period T each time P first time durations elapse.

For example, the clock device may pause for one clock period T, thereby adjusting the timing time backward one clock period T.

Case 2

If $Q_2=\lfloor Q_1 \rfloor$, the timing time of the clock device is adjusted forward one clock period T each time P first time durations elapse.

For example, the timing duration to reach a next timing point may be determined as $Q_2 \times T \times N - T$.

In the embodiment of the present application, the clock device may implement timing adjustments in 220 by setting different counters.

Optionally, the clock device includes a first counter and a second counter, the first counter is configured to record a number of elapsed clock periods T, and the second counter is configured to record a number of the elapsed first time durations. In this case, 220 may include 221 and 222.

In 221, when a number of the clock periods T recorded by the first counter is equal to $Q_2$, the first counter is set to zero, and 1 is added to the number of the first time durations recorded by the second counter.

In 222, when the number of the first time durations recorded by the second counter reaches P, one adjustment is performed on the timing time of the clock device, and the second counter is set to zero.

Specifically, the first counter is configured to count the elapsed clock period T, and the range of counting is from 0 to $Q_2-1$ ($Q_2$ count values in total). The second counter is configured to count the elapsed first time duration, and the range of counting is from 0 to P−1 (P count values in total), where $P=1/|Q_2-Q_1|$. For the first counter, a condition that the count value is added by 1 is that the current counter value of the second counter is not equal to P−1, and a condition of zeroing is that the count value of the first counter reaches $Q_2-1$. For the second counter, a condition of adding 1 is that the count value of the first counter reaches $Q_2-1$, and a condition of zeroing is that the count value of the second counter reaches P−1.

In other words, each time the first counter records $Q_2$ clock periods T (i.e., one first time duration is recorded), the count value of the second counter is added by 1, and each time the second counter records P first time durations, the clock device performs one adjustment to the timing time.

Therefore, the number of elapsed clock periods T and the number of elapsed first time durations are recorded by the two counters respectively, so that the timing adjustment may be performed in real time during the process of determining the timing points according to the timing duration, thereby realizing accurate timing.

Optionally, the clock device may further include a third counter, where the third counter is configured to record the number of elapsed first time durations, and in this case, 210 may further include 211 and 212.

In 211, when a number of the clock periods T recorded by the first counter is equal to $Q_2$, the number of the first time durations recorded by the third counter is added by 1.

In 212, when the number of the first time durations recorded by the third counter reaches N, it is determined that one timing point is reached and the third counter is set to zero.

Specifically, the third counter is also configured to count the elapsed first time duration, and the difference from the second counter is in that, the second counter performs timing adjustments according to the number of the recorded first time durations, and the third counter determines the timing point according to the number of the recorded first time durations. The counting range of the third counter is from 0 to N−1 (N count values in total). For the third counter, a condition of adding 1 is that the count value of the first counter reaches $Q_2-1$, and a condition of zeroing is that the count value of the second counter reaches N−1. In other words, each time the first counter records $Q_2$ clock periods T (i.e., $Q_2$ clock periods T is equal to one first time duration), the count value of the third counter is added by 1, and each time the third counter records N first time duration, the clock device determines that one timing point is reached.

Therefore, the timing point of the clock device can be determined based on the number of the elapsed first time durations recorded by the third counter.

Optionally, according to the timing method of the embodiment of the present application, timing error of the $M^{th}$ timing point of the clock device may be denoted as $$\frac{|(Q_2 \times T) - (Q_1 \times T)| \times \mathrm{mod}(N \times M, P)}{Q_1 \times T \times N \times M},$$

that is, $$\frac{|Q_2 - Q_1| \times \mathrm{mod}(N \times M, P)}{Q_1 \times N \times M}.$$

Mod is a remainder, that is, mod(N×m, P) denotes the remainder of (N×M) divided by P, and M is a positive integer.

Taking that C=1.25 ms and the clock device includes a 32.768 k crystal as an example, the timing method of the embodiment of the present application is described in detail below with reference to FIG. 5 and FIG. 6.

When C=1.25 ms, for the 32.768 k crystal, clock period T=1/32.768, $Q_1$=1.25/T=40.96, $Q_2$=⌈$Q_1$⌉=41, an actual timing point of the clock device is ⌈$Q_1$⌉×T×N×M=41×T×N×M. However, the real timing point should be 1.25×N×M.

Real timing point is 1.25×N×M=40.96×T×N×M=(41× T)×N×M−0.04×T×N×M=(41×T)×N×M−T×N×M×1/25.

The first half of the formula (41×T)×N×M is the actual timing point of the clock device, and the second half T×N×M×1/25 is a deviation between the actual timing point and the corresponding real timing point. It can be seen that when N×M is equal to an integral multiple of 25, a deviation between the actual timing point and the real timing point is an integer multiple of the clock period T. N×M may be understood as a total number of elapsed first time durations. Each time 25 first time durations elapse, the actual timing point is different from the real timing point by one clock period T, so that one timing adjustment is performed.

It should be understood that ⌈40.96⌉−40.96=0.04, 40.96− ⌊40.96⌋=0.96, since 0.04<0.96, $Q_2$=⌈$Q_1$⌉=41 may be used, so that error of the timing point determined according to the timing duration ⌈$Q_1$⌉×T×N is smaller.

In other words, when ⌈$Q_1$⌉−$Q_1$<$Q_1$−⌊$Q_1$⌋, $Q_2$=⌈$Q_1$⌉ may be selected; and when ⌈$Q_1$⌉−$Q_1$>$Q_1$−⌊$Q_1$⌋, $Q_2$=⌊$Q_1$⌋ may be selected.

Figure 5:
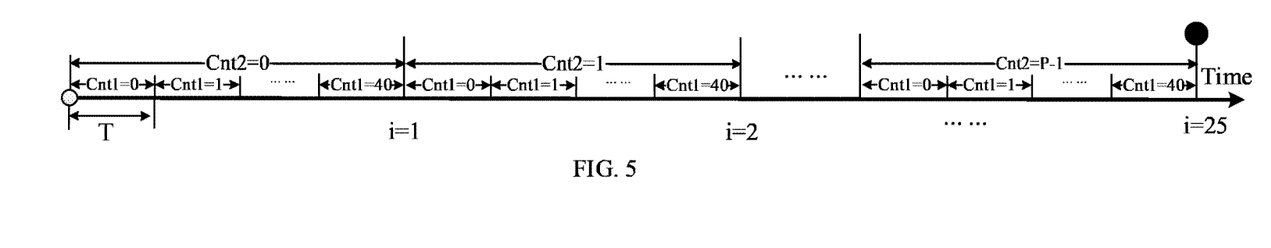
FIG. 5 is a schematic diagram of a timing adjustment at C=1.25 ms and T=1/32.768.

As shown in FIG. 5, the first Cnt1 is configured to record a number of elapsed first period, and the second counter Cnt2 is configured to record the number i of the elapsed first time duration, where the first time duration is 41×T. When the count value of the first counter Cnt1 reaches 40 from 0 (41 count values in total), the count value of the second counter Cnt2 is added by 1, and the count value of the first counter Cnt1 is set to zero. When the count value of the second counter Cnt2 reaches 24 from 0 (25 count values in total), the count value of the second counter Cnt2 is set to zero, and meanwhile, the clock device performs one timing adjustment to shorten the timing time for one clock period T, for example, timing starts after timing of the clock device pauses Tms. The time point indicated a black dot in FIG. 5 is the time at which the timing adjustment is performed.

Figure 6:
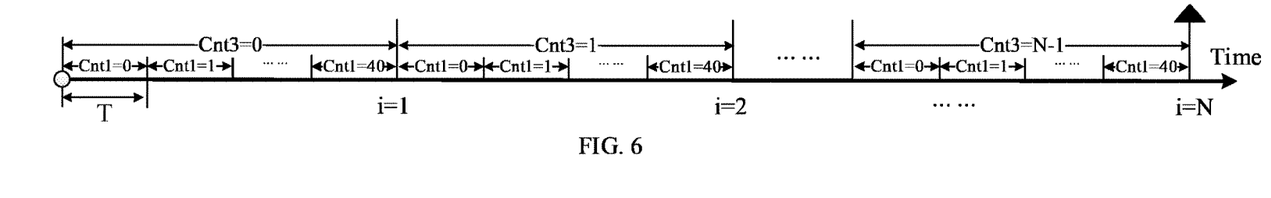
FIG. 6 is a schematic diagram of timing at C=1.25 ms and T=1/32.768.

As shown in FIG. 6, the third counter Cnt3 is configured to record the number i of the elapsed first time duration. When the count value of the first counter Cnt1 reaches 40 from 0 (41 count values in total), the count value of the third counter Cnt3 is added by 1, and the count value of the first counter Cnt1 is set to zero. When the count value of the third counter Cnt3 reaches N−1 from 0 (N count values in total), the count value of the third counter Cnt3 is set to zero, and it is determined that the clock device reaches one timing point. The time point indicated by a black triangle in FIG. 6 is one timing point.

Although the 32.768 k crystal causes that 1.25 ms is not an integer multiple of the clock period T of the clock device, the 32.768 k crystal has low power consumption and low price. With the timing method of the embodiment of the present application, accurate timing may be implemented by using a 32.768 k crystal, thereby satisfying timing with low power consumption and low cost.

It should be understood that the embodiment of the present application is described by taking C=1.25 ms as an example, but the value of the constant C is not limited thereto. Moreover, in addition to using a 32.768 k crystal, the clock device may also use another crystal having different clock periods for timing, which is not limited herein.

It should be understood that, in various embodiments of the present application, values of sequence numbers of the foregoing various processes do not mean an order of execution which should be determined based upon functionalities and internal logics thereof, rather than setting any limitation to implementation of the embodiments of the present application.

The timing method of the embodiment of the present application is described in detail above, and the clock device of the embodiment of the present application will be described below.

It should be understood that the clock device in the embodiment of the present application may perform the method in the embodiment of the present application, and have functions of executing the corresponding method.

Figure 7:
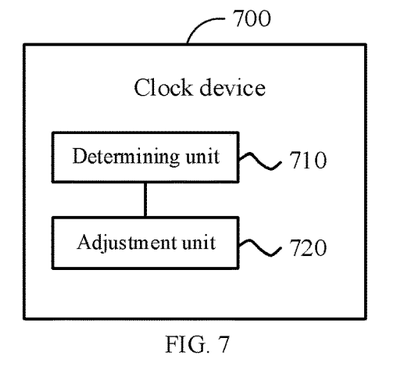
FIG. 7 is a schematic block diagram of a clock device according to an embodiment of the present application.

FIG. 7 shows a schematic block diagram of a clock device 700 according to an embodiment of the present application. As shown in FIG. 7, the clock device 700 may include a determining unit 710 and an adjustment unit 720.

The determining unit 710 is configured to determine a timing point according to a timing duration of a clock device, where a clock period of the clock device is T, the timing duration is N multiples of a first time duration, and the first time duration is equal to $Q_2$×T, where $Q_2$=⌈$Q_1$⌉ or $Q_2$=⌊$Q_1$⌋ and $Q_1$=C/T, N is a positive integer, $Q_1$ is not an integer, C is a constant, ⌈ ⌉ means rounding up, and ⌊ ⌋ means rounding down.

The adjustment unit is configured to perform one adjustment on timing time of the clock device each time P first time durations elapse, where an amount of time for each adjustment is one clock period T, P=1/|$Q_2$−$Q_1$|.

Therefore, for the clock device, in a timing process, if a ratio $Q_1$ of the constant C (for example, 1.25 ms) to the clock period T is not an integer, the timing point is determined according to the timing duration $Q_2$×T×N, and one timing adjustment is performed each time 1/|$Q_2$−$Q_1$|$Q_2$×T durations elapse, so as to ensure that timing error is kept within an acceptable range and will not increase with time, achieving accurate timing of the clock device. Moreover, timing with low power consumption and low cost can be satisfied.

Optionally, the clock device further includes a first counter and a second counter.

The first counter is configured to record a number of elapsed clock periods T, and when the number of the clock periods T recorded by the first counter is equal to $Q_2$, the first counter is set to zero.

The second counter is configured to record a number of the elapsed first time durations, where when the number of the clock periods recorded by the first counter is equal to $Q_2$, the second counter adds 1 to the number of the recorded first time durations, and when the number of the first time durations recorded by the second counter reaches P, the second counter is set to zero.

The adjustment unit 720 is specifically configured to perform one adjustment on timing time of the clock device when the number of the first time durations recorded by the second counter reaches P.

Optionally, the clock device further includes a third counter.

The third counter is configured to record a number of the elapsed first time durations, where the third counter adds 1 to the number of the recorded first time durations when the number of the clock periods T recorded by the first counter is equal to $Q_2$, and the third counter is set to zero when the number of the first time durations recorded by the third counter reaches N.

The determining unit 710 is specifically configured to determine that one timing point is reached when the number of the first time durations recorded by the third counter reaches P.

Optionally, if $Q_2=\lceil Q_1 \rceil$, the adjustment unit 720 is specifically configured to adjust the timing time of clock device backward one clock period T each time P first time durations elapse.

Optionally, if $Q_2=\lfloor Q_1 \rfloor$, the adjustment unit 720 is specifically configured to adjust the timing time of clock device forward one clock period T each time P first time durations elapse.

Optionally, timing error of the $M^{th}$ timing point of the clock device is $$\frac{|Q_2 - Q_1| \times \mathrm{mod}(N \times M, P)}{Q_1 \times N \times M},$$

where mod is a remainder, and M is a positive integer.

Optionally, a constant C=1.25 ms.

Optionally, 1/T=32.768 and P=25.

Figure 8:
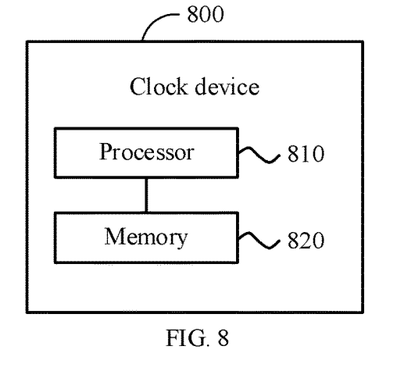
FIG. 8 is a schematic block diagram of a clock device according to an embodiment of the present application.

FIG. 8 shows a schematic block diagram of a clock device 800 according to an embodiment of the present application. As shown in FIG. 8, the clock device 800 includes a processor 810 and a memory 820. The memory 820 is configured to store instructions, and the processor 810 is configured to execute the instructions stored by the memory 820, and the execution of the instructions causes the processor 810 to perform the following operations.

A timing point is determined according to a timing duration of the clock device, where a clock period of the clock device is T, the timing duration is N multiples of a first time duration, the first time duration is equal to $Q_2 \times T$, where $Q_2=\lceil Q_1 \rceil$ or $Q_2=\lfloor Q_1 \rfloor$, $Q_1=C/T$, N is a positive integer, $Q_1$ is not an integer, C is a constant, $\lceil\ \rceil$ means rounding up, and $\lfloor\ \rfloor$ means rounding down.

One timing adjustment is performed on timing time of the clock device each time P first time durations elapse, where an amount of time for each adjustment is one clock period T, and $P=1/|Q_2-Q_1|$.

Optionally, the clock device further includes a first counter and a second counter.

The first counter is configured to record a number of elapsed clock periods T, and when the number of the clock periods T recorded by the first counter is equal to $Q_2$, the first counter is set to zero.

The second counter is configured to record a number of the elapsed first time durations, where when the number of the clock periods recorded by the first counter is equal to $Q_2$, the second counter adds 1 to the number of the recorded first time durations, and when the number of the first time durations recorded by the second counter reaches P, the second counter is set to zero.

The processor 810 is specifically configured to perform one adjustment on timing time of the clock device when the number of the first time durations recorded by the second counter reaches P.

Optionally, the third counter is configured to record a number of the elapsed first time durations, where when the number of the clock periods T recorded by the first counter is equal to $Q_2$, the third counter adds 1 to the number of the recorded first time durations, and when the number of the first time durations recorded by the third counter reaches N, the third counter is set to zero.

The processor 810 is specifically configured to:

determine that one timing point is reached when the number of the first time durations recorded by the third counter reaches N.

Optionally, if $Q_2=\lceil Q_1 \rceil$ is achieved, the processor 810 is specifically configured to adjust the timing time of clock device backward one clock period T each time P first time durations elapse.

Optionally, if $Q_2=\lfloor Q_1 \rfloor$ is achieved, the processor 810 is specifically configured to adjust the timing time of clock device forward one clock period T each time P first time durations elapse.

Optionally, timing error of the $M^{th}$ timing point of the clock device is $$\frac{|Q_2 - Q_1| \times \mathrm{mod}(N \times M, P)}{Q_1 \times N \times M},$$

where mod is a remainder, and M is a positive integer.

Optionally, a constant C=1.25 ms.

Optionally, 1/T=32.768 and P=25.

It should be understood that in the embodiments of the present application, the processor may be a central processing unit (Central Processing Unit, CPU), or may be a general purpose processor, a digital signal processor (DSP), an application-specific integrated circuit (ASIC), a field programmable gate arrays (FPGA) or another programmable logical device, a discrete gate or transistor logical device, or a discrete hardware component, or the like. The general-purpose processor may be a microprocessor or the processor may be any normal processor, or the like.

The memory may include a read-only memory and a random access memory, and provide an instruction and data for the processor. A part of the memory may further include a non-volatile random access memory. For example, the memory may also include information about timing parameters of the clock device.

In an implementation process, each step of the foregoing method may be completed by an integrated logic circuit of hardware or instructions in a software form in the processor. Steps of the positioning methods disclosed with reference to the embodiments of the present application may be directly executed and accomplished by means of a hardware processor, or may be executed and accomplished by using a combination of hardware and software modules in a processor. The storage medium is located in the memory, and a processor reads information in the memory and completes the steps in the foregoing methods in combination with hardware of the processor. The storage medium is positioned in a memory, and a processing module is used for reading information in the memory and completing the steps included in the aforementioned methods in combination with hardware thereof. To avoid repetition, details are not described herein again.

Figure 9:
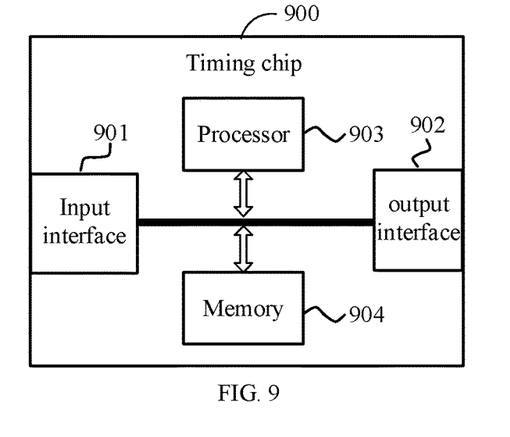
FIG. 9 is a schematic diagram of a chip according to an embodiment of the present application.

FIG. 9 is a schematic structural diagram of a timing chip according to an embodiment of the present application. The timing chip 900 in FIG. 9 includes an input interface 901, an output interface 902, at least one processor 903, and a memory 904. The input interface 901, the output interface 902, the processor 903, and the memory 904 are interconnected by an internal connection path. The processor 903 is configured to execute code in the memory 904.

Optionally, when the code is executed, the processor 903 may implement the method 200 performed by the clock device in the method embodiment. Details are not described herein.

The embodiment of the present application further provides a terminal device, which may include any clock device or timing chip in the foregoing embodiment of the present application.

Optionally, the clock device is a Bluetooth device.

Those of ordinary skill in the art may be aware that, units and algorithm steps of the examples described in the embodiments disclosed in this paper may be implemented by electronic hardware, computer software, or a combination of the two. Whether the functions are executed in a manner of hardware or software depends on a particular application and a design constraint condition of the technical solutions. Those skilled may implement the described functions by using different methods for each specific application, but this implementation should not be considered to be beyond the scope of the present application.

Those skilled in the art to which the present application pertains may clearly understand that, for convenience and simplicity of description, for the specific working processes of the system, the apparatus and the units described above, may refer to corresponding processes in the foregoing method embodiments, and will not be repeated redundantly herein.

In the several embodiments provided in the present application, it should be understood that, the disclosed system, apparatus and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings, or direct couplings, or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual requirements to achieve the objectives of the solutions of the embodiments.

In addition, functional units in the embodiments of this application may be integrated into one detecting unit, or each of the units may exist alone physically, or two or more units are integrated into one unit.

The foregoing descriptions are merely specific implementation manners of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A timing method, wherein the method comprises:
   determining a timing point according to a timing duration of a clock device, wherein a clock period of the clock device is T, the timing duration is N multiples of a first time duration, and the first time duration is equal to $Q_2 \times T$, wherein $Q_2 = \lceil Q_1 \rceil$ or $Q_2 = \lfloor Q_1 \rfloor$ and $Q_1 = C/T$, N is a positive integer, $Q_1$ is not an integer, C is a constant, $\lceil \ \rceil$ means rounding up, and $\lfloor \ \rfloor$ means rounding down; and
   performing one adjustment on timing time of the clock device each time P first time durations elapse, wherein an amount of time for each adjustment is one clock period T, $P=1/|Q_2-Q_1|$.

2. The method according to claim 1, wherein the clock device comprises a first counter and a second counter, the first counter is configured to record a number of elapsed clock periods T, and the second counter is configured to record a number of the elapsed first time durations; and
   the performing one adjustment on timing time of the clock device each time P first time durations elapse comprises:
   when the number of the clock periods T recorded by the first counter is equal to $Q_2$, setting the first counter to zero, and adding 1 to the number of the first time durations recorded by the second counter; and
   when the number of the first time durations recorded by the second counter reaches P, performing one adjustment on the timing time of the clock device, and setting the second counter to zero.

3. The method according to claim 2, wherein the clock device further comprises a third counter, and the third counter is configured to record the number of the elapsed first time durations; and
   the performing one adjustment on timing time of the clock device each time P first time durations elapse comprises:
   when the number of the clock periods T recorded by the first counter is equal to $Q_2$, adding 1 to the number of the first time durations recorded by the third counter; and
   when the number of the first time durations recorded by the third counter reaches N, determining that one timing point is reached and setting the third counter to zero.

4. The method according to claim 1, wherein $Q_2 = \lceil Q_1 \rceil$, and the performing one adjustment on timing time of the clock device each time P first time durations elapse comprises:
   adjusting the timing time of the clock device backward one clock period T each time P first time durations elapse.

5. The method according to claim 1, wherein $Q_2=\lfloor Q_1 \rfloor$, and the performing one adjustment on timing time of the clock device each time P first time durations elapse comprises:

adjusting the timing time of the clock device forward one clock period T each time P first time durations elapse.

6. The method according to claim 1, wherein timing error of the $M^{th}$ timing point of the clock device is $$\frac{|Q_2 - Q_1| \times \mathrm{mod}(N \times M, P)}{Q_1 \times N \times M},$$

wherein mod means modulo operation, and M is a positive integer.

7. The method according to claim 1, wherein a constant C=1.25 ms.

8. The method according to claim 1, wherein 1/T=32.768 and P=25.

9. A clock device, wherein the clock device comprises:
a determining unit, configured to determine a timing point according to a timing duration of a clock device, wherein a clock period of the clock device is T, the timing duration is N multiples of a first time duration, and the first time duration is equal to $Q_2 \times T$, wherein $Q_2=\lceil Q_1 \rceil$ or $Q_2=\lfloor Q_1 \rfloor$, and $Q_1=C/T$, N is a positive integer, $Q_1$ is not an integer, C is a constant, $\lceil\ \rceil$ means rounding up, and $\lfloor\ \rfloor$ means rounding down; and
an adjustment unit, configured to perform one adjustment on timing time of the clock device each time P first time durations elapse, wherein an amount of time for each adjustment is one clock period T, $P=1/|Q_2-Q_1|$.

10. The clock device according to claim 9, wherein the clock device further comprises a first counter and a second counter;
the first counter is configured to record a number of elapsed clock periods T, and the first counter is set to zero when the number of the clock periods T recorded by the first counter is equal to $Q_2$; and
the second counter is configured to record a number of the elapsed first time durations, wherein the second counter adds 1 to the number of the recorded first time durations when the number of the clock periods recorded by the first counter is equal to $Q_2$, and the second counter is set to zero when the number of the first time durations recorded by the second counter reaches P, wherein
the adjustment unit is specifically configured to:
when the number of the first time durations recorded by the second counter reaches P, perform one adjustment on the timing time of the clock device.

11. The clock device according to claim 10, wherein the clock device further comprises a third counter, the third counter is configured to record a number of the elapsed first time durations, wherein the third counter adds 1 to the number of the recorded first time durations when the number of the clock periods T recorded by the first counter is equal to $Q_2$, and the third counter is set to zero when the number of the first time durations recorded by the third counter reaches N, wherein
the determining unit is specifically configured to:
determine that one timing point is reached when the number of the first time durations recorded by the third counter reaches N.

12. The clock device according to claim 9, wherein $Q_2=\lceil Q_1 \rceil$, and the adjustment unit is specifically configured to:
adjust the timing time of the clock device backward one clock period T each time P first time durations elapse.

13. The clock device according to claim 9, wherein $Q_2=\lfloor Q_1 \rfloor$, and the adjustment unit is specifically configured to:
adjust the timing time of the clock device forward one clock period T each time P first time durations elapse.

14. The clock device according to claim 9, wherein timing error of the $M^{th}$ timing point of the clock device is $$\frac{|Q_2 - Q_1| \times \mathrm{mod}(N \times M, P)}{Q_1 \times N \times M},$$

wherein mod means modulo operation, and M is a positive integer.

15. The clock device according to claim 9, wherein a constant C=1.25 ms.

16. The clock device according to claim 9, wherein 1/T=32.768 and P=25.

17. A terminal device, comprising a clock device, wherein the clock device comprises:
a determining unit, configured to determine a timing point according to a timing duration of a clock device, wherein a clock period of the clock device is T, the timing duration is N multiples of a first time duration, and the first time duration is equal to $Q_2 \times T$, wherein $Q_2=\lceil Q_1 \rceil$ or $Q_2=\lfloor Q_1 \rfloor$, and $Q_1=C/T$, N is a positive integer, $Q_1$ is not an integer, C is a constant, $\lceil\ \rceil$ means rounding up, and $\lfloor\ \rfloor$ means rounding down; and
an adjustment unit, configured to perform one adjustment on timing time of the clock device each time P first time durations elapse, wherein an amount of time for each adjustment is one clock period T, $P=1/|Q_2-Q_1|$.

18. The terminal device according to claim 17, wherein the terminal device comprises a Bluetooth device.

* * * * *